United States Patent
Lee

(10) Patent No.: US 9,069,694 B2
(45) Date of Patent: Jun. 30, 2015

(54) MEMORY DEVICE AND METHOD OF OPERATING THE SAME

(75) Inventor: Byung-Hyun Lee, Seongnam-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 162 days.

(21) Appl. No.: 13/610,996

(22) Filed: Sep. 12, 2012

(65) Prior Publication Data

US 2013/0179760 A1 Jul. 11, 2013

(30) Foreign Application Priority Data

Jan. 9, 2012 (KR) .......................... 10-2012-0002320

(51) Int. Cl.
- *G06F 11/00* (2006.01)
- *G06F 11/10* (2006.01)
- *H03M 13/09* (2006.01)

(52) U.S. Cl.
CPC .......... *G06F 11/1004* (2013.01); *H03M 13/091* (2013.01)

(58) Field of Classification Search
USPC .......................................................... 714/807
See application file for complete search history.

(56) References Cited

U.S. PATENT DOCUMENTS

| | | | |
|---|---|---|---|
| 5,155,487 A * | 10/1992 | Tanaka et al. .................. | 341/100 |
| 6,161,207 A * | 12/2000 | Lockhart et al. ............... | 714/758 |
| 6,418,067 B1 | 7/2002 | Watanabe et al. | |
| 7,715,252 B2 | 5/2010 | Lee | |
| 7,911,853 B2 | 3/2011 | Kim | |
| 2004/0153952 A1 * | 8/2004 | Sharma et al. ................. | 714/781 |
| 2004/0228407 A1 * | 11/2004 | Kim et al. ................. | 375/240.12 |
| 2004/0237023 A1 | 11/2004 | Takahashi et al. | |
| 2005/0141279 A1 * | 6/2005 | Shin ......................... | 365/185.22 |
| 2006/0067531 A1 * | 3/2006 | Yamazaki ..................... | 380/239 |
| 2012/0117443 A1 * | 5/2012 | Lee et al. ...................... | 714/758 |
| 2012/0240017 A1 * | 9/2012 | Uchida .......................... | 714/821 |
| 2012/0311411 A1 * | 12/2012 | Kirkpatrick .................... | 714/807 |

OTHER PUBLICATIONS

Author: A vipsa S. Panda, G. L. Kumar; Title: Comparison of Serial Data-Input CRC and Parallel Data-Input CRC Design for CRC-8 ATM HEC employing MLFSR; Publisher: 2014 International Conference on Electronics and Communication System (ICECS—2014).*

* cited by examiner

*Primary Examiner* — Cynthia Britt
*Assistant Examiner* — Thien D Nguyen
(74) *Attorney, Agent, or Firm* — Muir Patent Law, PLLC

(57) ABSTRACT

A method for operating a memory device is disclosed. The method includes receiving a serial data and a serial cyclic redundancy check (CRC) code transmitted sequentially through a channel, converting the serial data into a parallel data and the serial CRC code into a parallel CRC code, outputting the parallel data at a first time point, outputting the parallel CRC code at a second time point later than the first time point, calculating a CRC code by using the parallel data, comparing the parallel CRC code and the calculated CRC code with each other and detecting an error of the serial data transmitted through the channel according to the result of the comparison, and outputting an error detection signal in response to the result of the comparison.

15 Claims, 18 Drawing Sheets

FIG. 1A

| | T0 | T1 | T2 | T3 | T4 | T5 | T6 | T7 | T8 | T9 |
|---|---|---|---|---|---|---|---|---|---|---|
| DQ0 | c0 | d1 | d2 | d3 | d4 | d5 | d6 | d7 | c0 | c4 |
| DQ1 | c8 | d9 | d10 | d11 | d12 | d13 | d14 | d15 | c1 | c5 |
| DQ2 | d16 | d17 | d18 | d19 | d20 | d21 | d22 | d23 | c2 | c6 |
| DQ3 | d24 | d25 | d26 | d27 | d28 | d29 | d30 | d31 | c3 | c7 |

FRAME 1

FIG. 1B

| | T0 | T1 | T2 | T3 | T4 | T5 | T6 | T7 | T8 | T9 |
|---|---|---|---|---|---|---|---|---|---|---|
| DQ0 | c0 | d1 | d2 | d3 | d4 | d5 | d6 | d7 | c0 | 1 |
| DQ1 | c8 | d9 | d10 | d11 | d12 | d13 | d14 | d15 | c1 | 1 |
| DQ2 | d16 | d17 | d18 | d19 | d20 | d21 | d22 | d23 | c2 | 1 |
| DQ3 | d24 | d25 | d26 | d27 | d28 | d29 | d30 | d31 | c3 | 1 |
| DQ4 | d32 | d33 | d34 | d35 | d36 | d37 | d38 | d39 | c4 | 1 |
| DQ5 | d40 | d41 | d42 | d43 | d44 | d45 | d46 | d47 | c5 | 1 |
| DQ6 | d48 | d49 | d50 | d51 | d52 | d53 | d54 | d55 | c6 | 1 |
| DQ7 | d56 | d57 | d58 | d59 | d60 | d61 | d62 | d63 | c7 | 1 |

FRAME 2

FIG. 1C

|      | T0   | T1   | T2   | T3   | T4   | T5   | T6   | T7   | T8  | T9 |
|------|------|------|------|------|------|------|------|------|-----|----|
| DQ0  | d0   | d1   | d2   | d3   | d4   | d5   | d6   | d7   | c0  | 1  |
| DQ1  | d8   | d9   | d10  | d11  | d12  | d13  | d14  | d15  | c1  | 1  |
| DQ2  | d16  | d17  | d18  | d19  | d20  | d21  | d22  | d23  | c2  | 1  |
| DQ3  | d24  | d25  | d26  | d27  | d28  | d29  | d30  | d31  | c3  | 1  |
| DQ4  | d32  | d33  | d34  | d35  | d36  | d37  | d38  | d39  | c4  | 1  |
| DQ5  | d40  | d41  | d42  | d43  | d44  | d45  | d46  | d47  | c5  | 1  |
| DQ6  | d48  | d49  | d50  | d51  | d52  | d53  | d54  | d55  | c6  | 1  |
| DQ7  | d56  | d57  | d58  | d59  | d60  | d61  | d62  | d63  | c7  | 1  |
| DQ8  | d64  | d65  | d66  | d67  | d68  | d69  | d70  | d71  | c8  | 1  |
| DQ9  | d72  | d73  | d74  | d75  | d76  | d77  | d78  | d79  | c9  | 1  |
| DQ10 | d80  | d81  | d82  | d83  | d84  | d85  | d86  | d87  | c10 | 1  |
| DQ11 | d88  | d89  | d90  | d91  | d92  | d93  | d94  | d95  | c11 | 1  |
| DQ12 | d96  | d97  | d98  | d99  | d100 | d101 | d102 | d103 | c12 | 1  |
| DQ13 | d104 | d105 | d106 | d107 | d108 | d109 | d110 | d111 | c13 | 1  |
| DQ14 | d112 | d113 | d114 | d115 | d116 | d117 | d118 | d119 | c14 | 1  |
| DQ15 | d120 | d121 | d122 | d123 | d124 | d125 | d126 | d127 | c15 | 1  |

FRAME 3

FIG. 2A

| | T0 | T1 | T2 | T3 | T4 | T5 | T6 | T7 | T8 | T9 |
|---|---|---|---|---|---|---|---|---|---|---|
| DQ0 | c0 | d1 | d2 | d3 | 1 | 1 | 1 | 1 | c0 | c4 |
| DQ1 | c8 | d9 | d10 | d11 | 1 | 1 | 1 | 1 | c1 | c5 |
| DQ2 | d16 | d17 | d18 | d19 | 1 | 1 | 1 | 1 | c2 | c6 |
| DQ3 | d24 | d25 | d26 | d27 | 1 | 1 | 1 | 1 | c3 | c7 |

FRAME 4

FIG. 2B

| | T0 | T1 | T2 | T3 | T4 | T5 | T6 | T7 | T8 | T9 |
|---|---|---|---|---|---|---|---|---|---|---|
| DQ0 | c0 | d1 | d2 | d3 | 1 | 1 | 1 | 1 | c0 | 1 |
| DQ1 | c8 | d9 | d10 | d11 | 1 | 1 | 1 | 1 | c1 | 1 |
| DQ2 | d16 | d17 | d18 | d19 | 1 | 1 | 1 | 1 | c2 | 1 |
| DQ3 | d24 | d25 | d26 | d27 | 1 | 1 | 1 | 1 | c3 | 1 |
| DQ4 | d32 | d33 | d34 | d35 | 1 | 1 | 1 | 1 | c4 | 1 |
| DQ5 | d40 | d41 | d42 | d43 | 1 | 1 | 1 | 1 | c5 | 1 |
| DQ6 | d48 | d49 | d50 | d51 | 1 | 1 | 1 | 1 | c6 | 1 |
| DQ7 | d56 | d57 | d58 | d59 | 1 | 1 | 1 | 1 | c7 | 1 |

FRAME 5

FIG. 2C

|      | T0   | T1   | T2   | T3   | T4 | T5 | T6 | T7 | T8  | T9 |
|------|------|------|------|------|----|----|----|----|-----|----|
| DQ0  | d0   | d1   | d2   | d3   | 1  | 1  | 1  | 1  | c0  | 1  |
| DQ1  | d8   | d9   | d10  | d11  | 1  | 1  | 1  | 1  | c1  | 1  |
| DQ2  | d16  | d17  | d18  | d19  | 1  | 1  | 1  | 1  | c2  | 1  |
| DQ3  | d24  | d25  | d26  | d27  | 1  | 1  | 1  | 1  | c3  | 1  |
| DQ4  | d32  | d33  | d34  | d35  | 1  | 1  | 1  | 1  | c4  | 1  |
| DQ5  | d40  | d41  | d42  | d43  | 1  | 1  | 1  | 1  | c5  | 1  |
| DQ6  | d48  | d49  | d50  | d51  | 1  | 1  | 1  | 1  | c6  | 1  |
| DQ7  | d56  | d57  | d58  | d59  | 1  | 1  | 1  | 1  | c7  | 1  |
| DQ8  | d64  | d65  | d66  | d67  | 1  | 1  | 1  | 1  | c8  | 1  |
| DQ9  | d72  | d73  | d74  | d75  | 1  | 1  | 1  | 1  | c9  | 1  |
| DQ10 | d80  | d81  | d82  | d83  | 1  | 1  | 1  | 1  | c10 | 1  |
| DQ11 | d88  | d89  | d90  | d91  | 1  | 1  | 1  | 1  | c11 | 1  |
| DQ12 | d96  | d97  | d98  | d99  | 1  | 1  | 1  | 1  | c12 | 1  |
| DQ13 | d104 | d105 | d106 | d107 | 1  | 1  | 1  | 1  | c13 | 1  |
| DQ14 | d112 | d113 | d114 | d115 | 1  | 1  | 1  | 1  | c14 | 1  |
| DQ15 | d120 | d121 | d122 | d123 | 1  | 1  | 1  | 1  | c15 | 1  |

FRAME 6

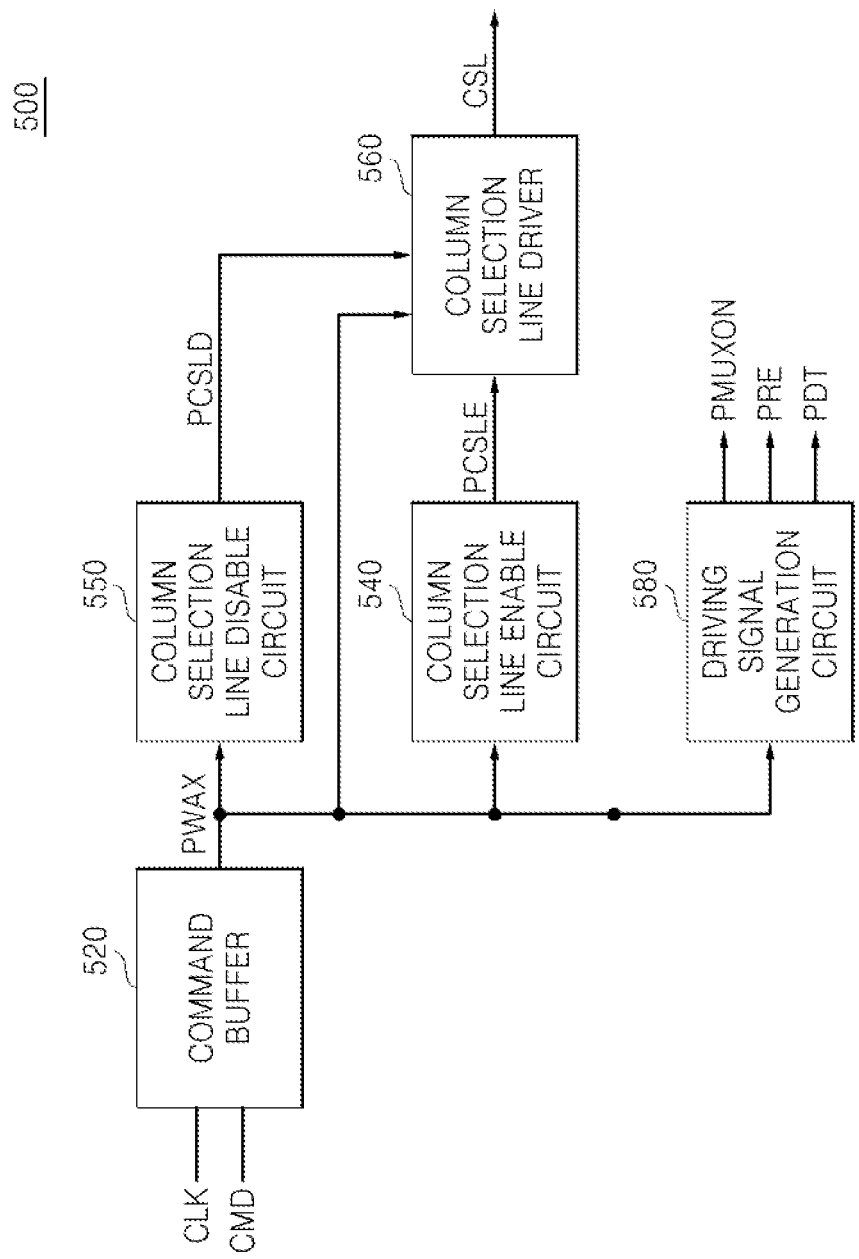

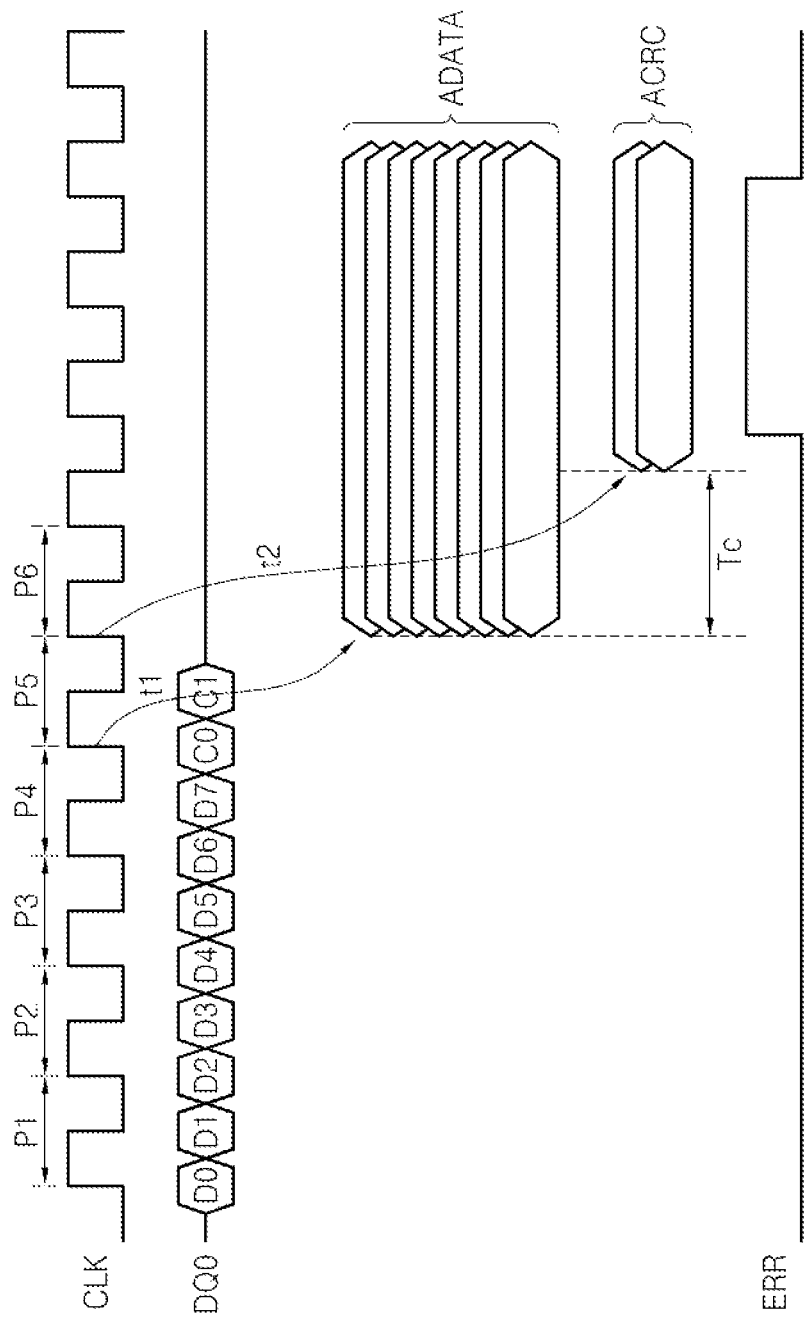

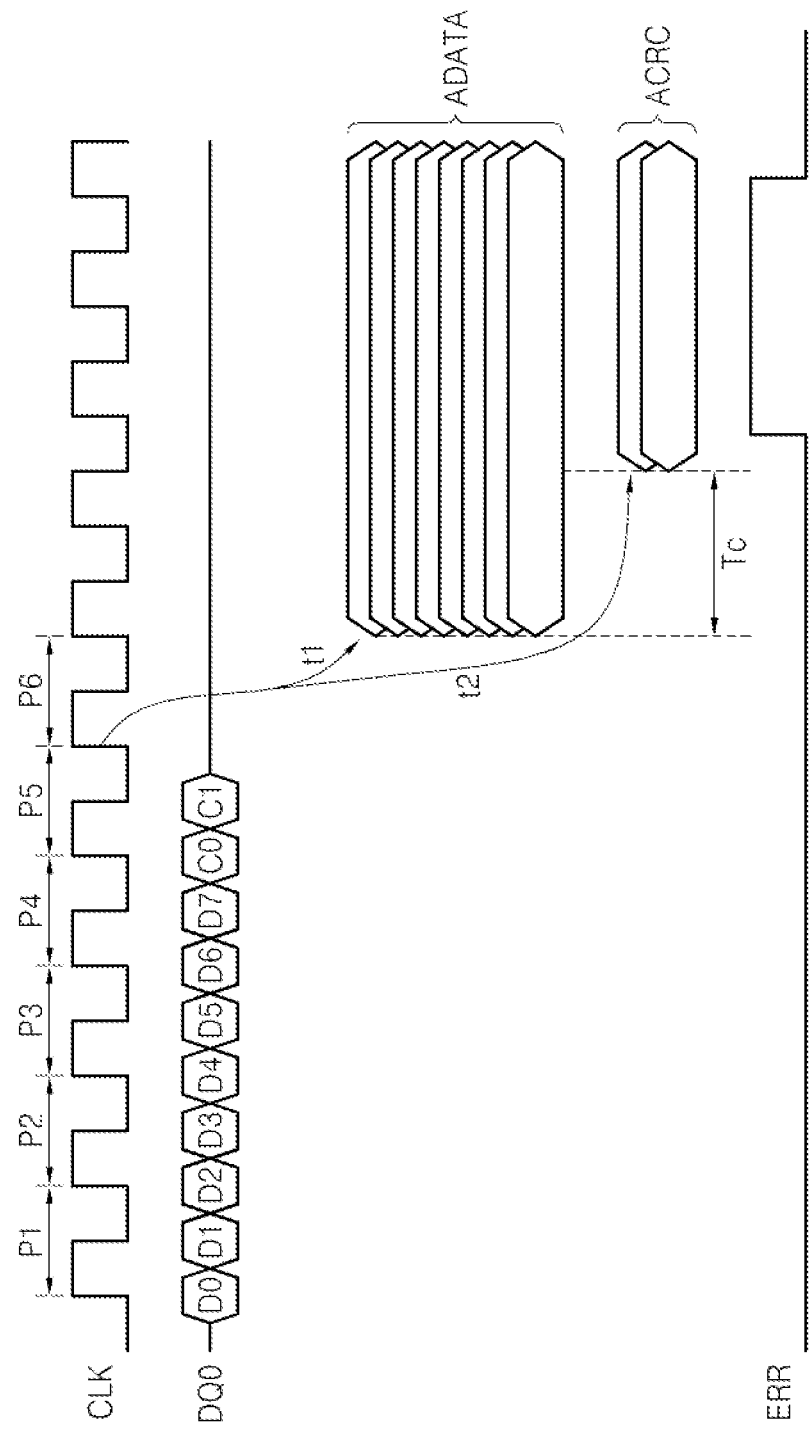

MEMORY DEVICE AND METHOD OF OPERATING THE SAME

CROSS-REFERENCE TO RELATED APPLICATIONS

This application claims priority under 35 U.S.C. §119(a) from Korean Patent Application No. 10-2012-0002320 filed on Jan. 9, 2012, the disclosure of which is hereby incorporated by reference in its entirety.

BACKGROUND

Example embodiments relate to a memory device, and more particularly, to a memory device detecting an error occurred during data transmission and blocking writing of the data to a memory cell array when the error is detected, and a method for operating the memory device.

As a semiconductor system has been rapid, an operating speed of a semiconductor device becomes a factor restricting the performance of the semiconductor system. To solve the factor, a high performance DRAM such as a synchronous dynamic random access memory (SDRAM) and a double data rate SDRAM (DDR SDRAM), which the operating speed has been increased, is being developed.

However, as the operating speed of a memory device has been increased, an error of a data transmitted to the memory device from the outside may be generated, thereby decreasing reliability of the data transmitted to a memory core included in the memory device.

SUMMARY

According to some embodiments of the present disclosure, there is provided a method for operating a memory device. The method includes receiving a serial data and a serial cyclic redundancy check (CRC) code transmitted sequentially through a channel, converting the serial data into a parallel data and the serial CRC code into a parallel CRC code, outputting the parallel data at a first time point, outputting the parallel CRC code at a second time point later than the first time point, calculating a CRC code by using the parallel data, comparing the parallel CRC code and the calculated CRC code with each other and detecting an error of the serial data transmitted through the channel according to the result of the comparison, and outputting an error detection signal in response to the result of the comparison.

According to another embodiments of the present disclosure, there is provided a method for operating a memory device. The method includes receiving a serial data and a serial cyclic redundancy check (CRC) code transmitted sequentially through a channel in response to a clock signal, converting the serial data into a parallel data and the serial CRC code into a parallel CRC code, outputting the parallel data at a first time point, outputting the parallel CRC code at a second time point later than the first time point, calculating a CRC code by using the parallel data, comparing the parallel CRC code and the calculated CRC code with each other to determine whether an error of the serial data is detected, outputting an error detection signal indicating whether the error is detected or not, in response to an error detection signal indicating that an error is detected, blocking writing of the parallel data to the memory cell array, and in response to an error detection signal indicating that an error is not detected, writing the parallel data to the memory cell array.

According to other embodiments of the present disclosure, there is provided a memory device. The memory device includes a memory cell array, a data parallel circuit, a CRC circuit, and a control circuit. The memory cell array includes a plurality of memory cells. The data parallel circuit is configured to parallelize each of a serial data and a serial cyclic redundancy check (CRC) code transmitted through a channel in response to a clock signal and output a parallel data and a parallel CRC code, respectively. The control circuit is configured to output a plurality of control signals for controlling a write operation for writing the parallel data to one or more memory cells of the plurality of memory cells. The data parallel circuit is configured to output the parallel data at a first time point and output the parallel CRC code at a second time point later than the first time point.

BRIEF DESCRIPTION OF THE DRAWINGS

Exemplary embodiments will be more clearly understood from the following detailed description taken in conjunction with the accompanying drawings in which:

FIGS. 1A, 1B, and 1C illustrate a frame format of a data which is input to a memory device according to exemplary embodiments and has a burst length of 8;

FIGS. 2A, 2B, and 2C illustrate a frame format of a data which is input to a memory device according to another exemplary embodiments and has a burst length of 4;

FIG. 5 is a block diagram of a control circuit of FIG. 4 according to an exemplary embodiment;

FIG. 6 is an operation timing diagram for explaining an exemplary embodiment of the operation of the memory device shown in FIG. 3;

FIG. 7B is an operation timing diagram for explaining other exemplary embodiment of the operation of the memory device shown in FIG. 3;

DETAILED DESCRIPTION

Figure 3:
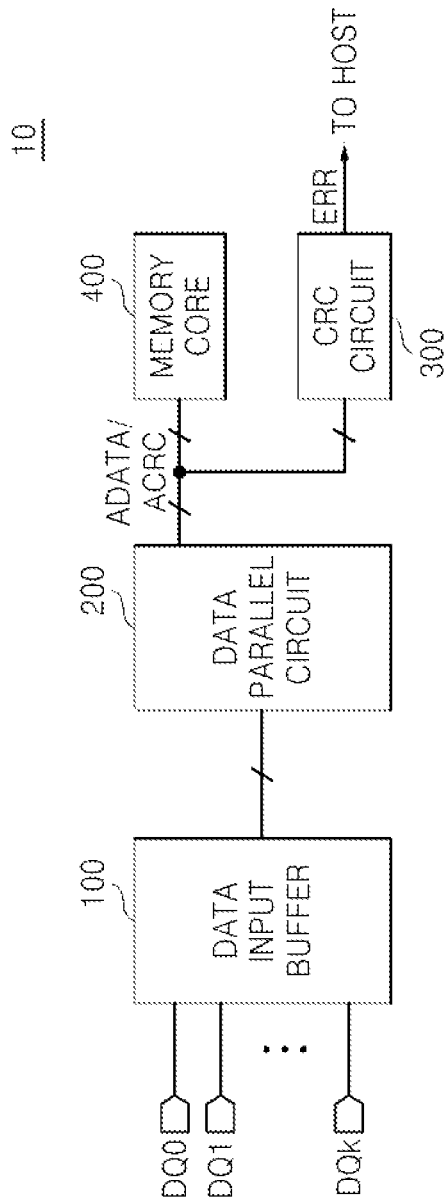
FIG. 3 is a block diagram of a memory device according to an exemplary embodiment.

The present disclosure will now be described in some additional detail with reference to the accompanying drawings that illustrate certain exemplary embodiments. This inventive concept may, however, be embodied in many different forms and should not be construed as being limited to only the illustrated embodiments. Throughout the drawings like reference numbers and labels are used to indicate like or similar elements and related signals.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. Unless indicated otherwise, these terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which the disclosure belongs. It will be further understood that terms, such as those defined in commonly used dictionaries, should be interpreted as having a meaning that is consistent with their meaning in the context of the relevant art and/or the present disclosure, and will not be interpreted in an idealized or overly formal sense unless expressly so defined herein.

FIGS. 1A, 1B, and 1C illustrate a frame format of a data which is input to a memory device according to exemplary embodiments and has a burst length of 8. Referring to FIG. 1A, a first frame format FRAME 1 may include four rows and ten columns. Bits included in each row are transmitted through an identical channel, for example, any one of a plurality of data input pads. Bits included in each row are transmitted within an identical unit interval. For example, the first frame format FRAME 1 may be used in a memory device including at least four data input pads DQ0 through DQ3.

For example, in one embodiment, a first data bit d0 through an eighth data bit d7, a first cyclic redundancy check (CRC) bit c0, and a fifth CRC bit c4 are input through the first data input pad DQ0.

A ninth bit d8 through a sixteenth data bit d15, a second CRC bit c1, and a sixth CRC bit c5 are input through the second input pad DQ1. A seventeenth data bit c16 through a twenty-fourth bit d23, a third CRC bit c2, and a seventh CRC bit c6 are input through the third input pad DQ2. A twenty-fifth bit d24 through a thirty-second data bit d31, a fourth CRC bit c3, and a eighth CRC bit c7 are input through the fourth data input pad DQ3.

A burst length of the first frame format FRAME 1 is 8. Accordingly, data bits are transmitted from each of the data input pads DQ0 through DQ3 during a first time interval T0 through an eighth time interval T7. Also, CRC bits are transmitted from each of the data input pads DQ0 through DQ3 during a ninth time interval T8 through a tenth time interval T9.

Referring to FIG. 1B, a second frame format FRAME 2 may include eight rows and ten columns. Thus, the second frame format FRAME 2 may be used in a memory device including at least eight data input pads DQ0 through DQ7.

For example, a first data bit d0 through an eighth data bit d7, a first CRC bit c0, and a logical value "1" are input through a first data input pad DQ0.

A burst length of the second frame format FRAME 2 is 8. Accordingly, data bits are transmitted from each of the data input pads DQ0 through DQ7 during a first time interval T0 through a eighth time interval T7. Also, each of CRC bits c0 through c7 are transmitted from each of the data input pads DQ0 through DQ7.

In some embodiments, a bit having a logical value "1" may be transmitted from each of the data input pads DQ0 through DQ7 during a tenth time interval T9. And in another embodiments, a bit having a logical value "0" may be transmitted from each of the data input pads DQ0 through DQ7 during a tenth time interval T9. The bit of a logical value "1" or "0" transmitted during the tenth time interval T9 may be a redundant bit that may not be used in a write operation and/or an error detection operation of data transmission of a memory device.

Referring to FIG. 1C, a third frame format FRAME 3 may include sixteen rows and ten columns. Thus, the third frame format FRAME 3 may be used in a memory device including at least sixteen data input pads DQ0 through DQ15. For example, a first data bit d0 through an eighth data bit d7, a first CRC bit c0, and a logical value "1" are input through a first data input pad DQ0.

A burst length of the third frame format FRAME 3 is 8. Accordingly, data bits are transmitted from each of the input pads DQ0 through DQ15 during a first time interval T0 through an eighth time interval T7. Also, each of CRC bits c0 through c15 may be transmitted from each of the data input pads DQ0 through DQ15.

In some embodiments, a bit having a logical value "1" may be transmitted from each of the data input pads DQ0 through DQ15 during a tenth time interval T9. And in another embodiments, a bit having a logical value "0" may be transmitted from each of the data input pads DQ0 through DQ15 during a tenth time interval T9. The bit of a logical value "1" or "0" transmitted during the tenth time interval T9 may be a redundant bit that may not be used in a write operation and/or an error detection operation of data transmission of a memory device.

FIGS. 2A, 2B, and 2C illustrate a frame format of a data which is input to a memory device according to other exemplary embodiments having a burst length of 4. Referring to FIG. 2A, a fourth frame format FRAME 4 may include four rows and ten columns. Thus, the fourth frame format FRAME 4 may be used in a memory device including at least four data input pads DQ0 through DQ3. For example, a first data bit d0 through a fourth data bit d3, a first CRC bit c0, and a fifth CRC bit c4 are input through the first data input pad DQ0. Bits having a logical value "1" are transmitted through the first data input pad DQ0 during a fifth time interval T4 through an eight time interval T7.

A burst length of the fourth frame format FRAME 4 is 4. Accordingly, data bits are transmitted from each of the data input pads DQ0 through DQ3 during a first time interval T0 through a fourth time interval T3. Also, bits having a logical value "1" are transmitted from each of the data input pads DQ0 through DQ3 during a fifth time interval T4 through an eighth time interval T7. The bits having a logical value "1" may be replaced by the bits having a logical value "0".

Referring to FIG. 2B, a fifth frame format FRAME 5 may include eight rows and ten columns. Accordingly, the fifth frame format FRAME 5 may be used in a memory device including at least eight data input pads DQ0 through DQ7. For example, a first data bit d0 through a fourth data bit d3 and a first CRC bit c0 are input through the first data input pad DQ0.

A burst length of the fifth frame format FRAME 5 is 4. Accordingly, data bits are transmitted from the data input pads DQ0 through DQ7 during a first time interval T0 through a fourth time interval T3. Bits having a logical value "1" are transmitted from each of the data input pads DQ0 through DQ7 during a fifth time interval T4 through an eighth time interval T7. Each of CRC bits c0 through c7 may be transmitted from each of the data input pad DQ0 through DQ7 during a ninth time interval T8, and bits having a logical value "1" may be transmitted from each of the data input pads DQ0 through DQ7 during a tenth time interval T9. Bits having a logical value "1" may be replaced by bits having a logical value "0".

Referring to FIG. 2C, a sixth frame format FRAME 6 may include sixteen rows and ten columns. Accordingly, the sixth frame format FRAME 6 may be used in a memory device including at least sixteen data input pads DQ0 through DQ15. For example, a first data bit d0 through a fourth data bit d3 and a first CRC bit c0 are input through the first data input pad DQ0.

A burst length of the sixth frame format FRAME 6 is 4. Accordingly, data bits are transmitted from each of the data input pads DQ0 through DQ15 during a first time interval T0 through a fourth time interval T3. Bits having a logical value "1" are transmitted from each of the data input pads DQ0 through DQ15 during a fifth time interval T4 through an eighth time interval T7. Each of CRC bits c0 through c15 is transmitted from each of the data input pads DQ0 through DQ15 during a ninth time interval T8, and bits having a logical value "1" may be transmitted from each of the data input pad DQ0 through DQ15 during a tenth time interval T9. Bits having a logical value "1" may be replaced by bits having a logical value "0".

The number of data input pads described referring to FIGS. 1A through 2C is 4, 8, or 16. But the embodiments of the disclosure are not restricted into the number of data input pads.

FIG. 3 is a block diagram of a memory device according to an exemplary embodiment. The memory device may include a volatile memory device and/or a non-volatile memory device.

The volatile memory device may include, for example, a dynamic random access memory (DRAM), static random access memory (SRAM), thyristor RAM (T-RAM), zero capacitor ram (Z-RAM), or twin transistor RAM (TTRAM).

The non-volatile memory device may include, for example, an electrically erasable programmable read-only memory (EEPROM), flash memory, magnetic RAM (MRAM), spin-transfer torque MRAM, conductive bridging RAM (CBRAM), ferroelectric RAM (FERAM), phase change RAM (PRAM), resistive RAM (RRAM), nanotube RRAM, polymer RAM (PoRAM), nano floating gate memory (NFGM), holographic memory, molecular electronics memory device, or insulator resistance change memory.

Referring to FIG. 3, the memory device 10 may include a data input buffer 100, a data parallel circuit (or serial-to-parallel converting circuit) 200, a cyclic redundancy check (CRC) circuit 300, and a memory core 400.

The memory device 10 may be, for example, a synchronous dynamic random access memory (SDRAM) or double data rate SDRAM (DDR SDRAM).

The data input buffer 100 buffers a data transmitted from a host (not shown) through a plurality of data input pads DQ0 through DQk (k is a natural number). The data parallel circuit 200 converts a serial data and a serial CRC code output from the data input buffer 100 into a parallel data ADATA and a parallel CRC code ACRC, respectively.

The CRC circuit 300 calculates a CRC code by using the parallel data ADATA output from the data parallel circuit 200. Also, the CRC circuit 300 compares the parallel CRC code ACRC output from the data parallel circuit 200 and the calculated CRC code with each other and detects an error of the serial data based on the result of comparison. The error of the serial data may denote an error that may have occurred in the process of the serial data transmission from a host through a channel.

When the error is detected from the serial data, the CRC circuit 300 outputs an error detection signal ERR having an activation period (e.g., enabled error detection signal) into the host. The host may retransmit the serial data having any one of frame formats FRAME 1 through FRAME 6 shown in FIGS. 1A through 2C in response to the enabled error detection signal ERR. Additionally, if an error is not detected from the serial data, the CRC circuit 300 outputs an error detection signal ERR having a deactivation period (e.g., disabled error detection signal) to the host.

The memory core 400 may perform the write operation for writing the parallel data ADATA output from the data parallel circuit 200 to in each of a plurality of memory cells of a memory cell array included in the memory core 400 in response to a command signal (not shown), for example, a write command signal, received from the host.

In one embodiment, one or all of the data input buffer 100, the data parallel circuit 200, the CRC circuit 300, and the memory core 400 may be controlled in response to a clock signal CLK (not shown).

Figure 4:
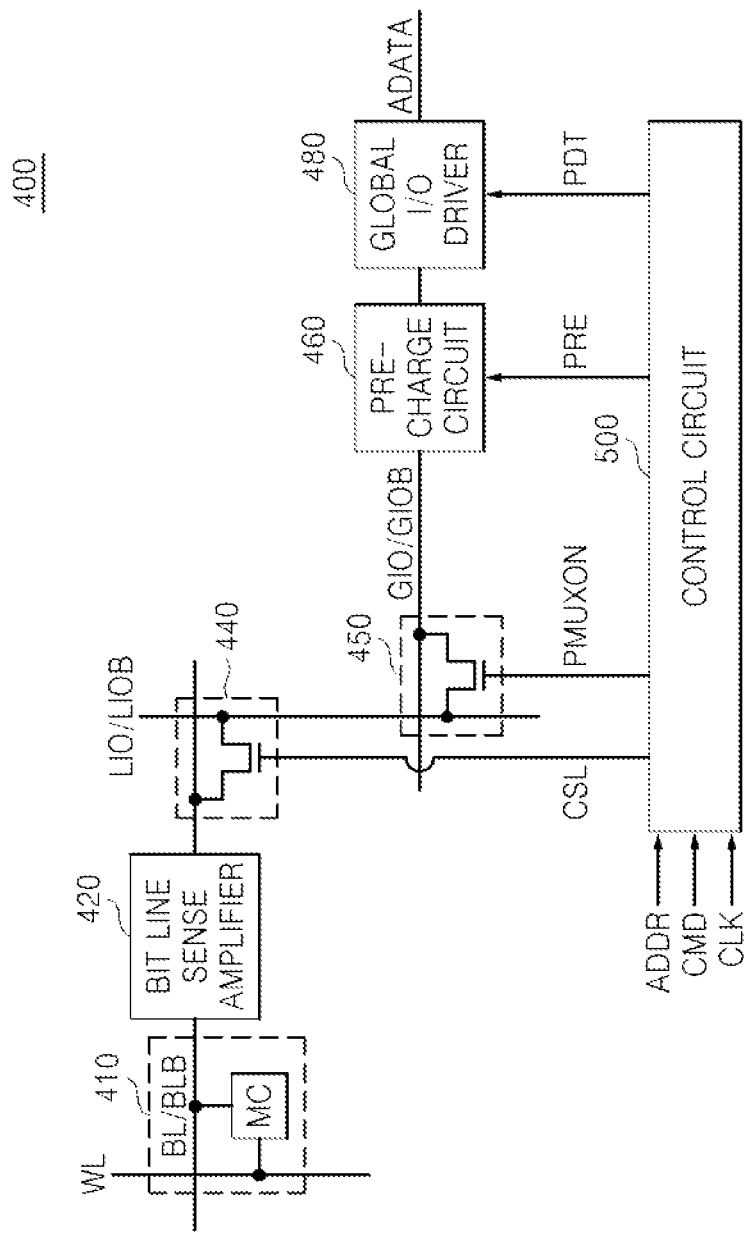
FIG. 4 illustrates a memory core shown in FIG. 3 according to an exemplary embodiment.

FIG. 4 illustrates a memory core shown in FIG. 3 according to an exemplary embodiment. Referring to FIGS. 3 and 4, the memory core 400 may include a memory cell array 410, a bit line sense amplifier 420, a column selection circuit 440, a local-global input/output gate circuit 450, a precharge circuit 460, a global input/output driver 480, and a control circuit 500.

The memory cell array 410 may include a plurality of memory cells. Each memory cell MC of the plurality of memory cells may be arranged in a form of matrix. The memory cell MC is connected between a bit line BL or a complementary bit line BLB and a word line WL. A parallel data ADATA output from the data parallel circuit 200 may be written to the memory cell MC.

FIG. 4 illustrates one memory cell MC connected between a word line WL and a bit line BL or a complementary bit line BLB, for convenience of explanation.

The bit line sense amplifier 420 amplifies a data stored in the memory cell MC by amplifying a voltage difference or a current difference between the bit line BL and the complementary bit line BLB. The column selection circuit 440 is connected between the bit line BL and a local input/output line LIO, and/or between the complementary bit line BLB and a complementary local input/output line LIOB. The column selection circuit 440 controls the connection between the bit line pair BL/BLB and the local input/output line pair LIO/LIOB in response to a column selection line signal CSL.

For example, when the column selection line signal CSL output from the control circuit 500 is activated, the column selection circuit 440 controls the connection between the bit line pair BL/BLB and the local input/output line pair LIO/LIOB such that a parallel data ADATA may be transmitted between the bit line pair BL/BLB and the local input/output line pair LIO/LIOB. In one embodiment, when the column selection circuit 440 is embodied into at least one NMOS transistor, the column selection line signal CSL may be activated into a high level.

The local-global input/output gate circuit 450 is connected between the local input/output line LIO and a global input/output line GIO, and/or the complementary local input/output line LIOB and a complementary global input/output line GIOB. The local-global input/output gate circuit 450 may control the connection between the local input/output line pair LIO/LIOB and the global input/output line pair GIO/GIOB in response to a local-global input/output selection signal PMUXON output from the control circuit 500.

For example, when the local-global input/output selection signal PMUXON output from the control circuit 500 is activated, the local-global input/output gate 450 may control the connection between the local input/output line pair LIO/LIOB and the global input/output line pair GIO/GIOB such that the parallel data ADATA may be transmitted between the local input/output line pair LIO/LIOB and the global input/output line pair GIO/GIOB.

The pre-charge circuit 460 precharges the global input/output line GIO and the complementary global input/output line GIOB into a predetermined precharge voltage level in response to a precharge signal PRE output from the control circuit 500.

The global input/output driver 480 drives the global input/output line pair GIO/GIOB through the precharge circuit 460 in response to the parallel data ADATA output from the data parallel circuit 200 and an enable signal PDT output from the control circuit 500 in the write operation.

The control circuit 500 drives the selected word line WL and outputs the column selection line signal CSL, the local-global input/output selection signal PMUXON, the precharge signal PRE, and the enable signal PDT in response to an address signal ADDR, a clock signal CLK, and a command signal CMD. In one embodiment, the command signal CMD may include the address signal ADDR.

FIG. 5 is a block diagram of the control circuit shown in FIG. 4 according to an exemplary embodiment. Referring to FIG. 3 through FIG. 5, the control circuit 500 includes a command buffer 520, a column selection line enable circuit 540, a column selection line disable circuit 550, a column selection line driver 560, and a driving signal generation circuit 580.

The command buffer 520 outputs a write activation signal PWAX to perform the write operation in response to the clock signal CLK and the command signal CMD, for example, a write command signal. The command buffer 520 may output a control signal for driving a word line WL corresponding to an address signal ADDR. For example, the command signal CMD may include the address signal ADDR. Thus, FIG. 5 is not showing the address signal ADDR separately.

The column selection line enable circuit 540 outputs a column selection enable signal PCSLE to control an activation time point and/or an activation period of the column selection line signal CSL, which is an output signal of the column selection driver 560, in response to the write activation signal PWAX.

The column selection line disable circuit 550 outputs a column selection line disable signal PCSLD to control a deactivation time point and/or a deactivation period of the column selection line signal CSL in response to the write activation signal PWAX. The column selection line driver 560 outputs the column selection line signal CSL for selecting the bit line pair BL/BLB corresponding to the memory cell MC in which the write operation is to be performed in response to the write activation signal PWAX.

In one embodiment, the activation time point and/or the activation period of the column selection line signal CSL is determined by the column selection line enable signal PCSLE, and the deactivation time point and/or the deactivation period of the column selection line signal CSL is determined by the column selection line disable signal PCSLD.

The driving signal generation circuit 580 outputs a local-global input/output selection signal PMUXON and an enable signal PDT in response to the write activation signal PWAX.

The local-global input/output selection signal PMUXON is the control signal for controlling the transmitting operation of the parallel data ADATA from the global input/output line pair GIO/GIOB into the local input/output line pair LIO/LIOB. The enable signal PDT is the control signal for enabling the global input/output line driver 480.

FIG. 6 is an operation timing diagram for explaining an exemplary embodiment of the memory device of FIG. 3. Referring to FIGS. 3 through 6, the data input buffer 100 receives the serial data D0~D7 and the serial CRC code C0, C1 input according to the clock signal CLK. For example, the serial data D0~D7 may be 8-bits, and the CRC code C0, C1 may be 2-bits.

For example, in one embodiment, a first data bit D0 included in the serial data D0~D7 is input according to a rising edge of a first period P1 of the clock signal CLK, and a second data bit D1 is input according to a falling edge of the first period P1.

A third data bit D2 is input according to a rising edge of a second period P2 of the clock signal CLK, and a fourth data bit D3 is input according to a falling edge of the second period P2. A fifth data bit D4 is input according to a rising edge of a third period P3 of the clock signal CLK, and a sixth data bit D5 is input according to a falling edge of the third period P3. A seventh data bit D6 is input according to a rising edge of a fourth period P4 of the clock signal CLK, and a eighth data bit D7 is input according to a falling edge of the fourth period P4.

A first CRC bit C0 included in the serial CRC code is input according to a rising edge of a fifth period P5 of the clock signal CLK, and a second CRC bit C1 is input according to a falling edge of the fifth period P5.

The data parallel circuit 200 may parallelize an output signal of the data input buffer 100. That is, the data parallel circuit 200 parallelizes the serial data D0~D7 and the serial CRC code C0, C1 and outputs the parallel data ADATA and the parallel CRC code (ACRC).

The data parallel circuit 200 may determine a time point of outputting the parallel data ADATA in response to a rising edge of the fifth period P5, and a time point of outputting the parallel CRC code (ACRC) in response to a rising edge of a sixth period P6 of the clock signal CLK. For example, the data parallel circuit 200 may cause the rising edge of the fifth period P5 (e.g., the first rising edge following the completion of all data being input) to trigger output of the parallel data ADATA. Outputting of the data ADATA may then occur after a slight delay (e.g., t1). A delay time t1 indicates a delay time from the rising edge of the fifth period P5 to the time point of outputting the parallel data ADATA. For example, the delay time t1 may be the same as or greater than one period of the clock signal CLK. A delay time t2 indicates a delay time from the rising edge of the sixth period P6 to the time point of outputting the parallel CRC code (ACRC). For example, the delay time t2 may be the same as or greater than one period of the clock signal CLK. For example, the data parallel circuit 200 may cause the rising edge of the sixth period P6 (e.g., the first rising edge following the completion of the serial CRC code being input) to trigger output of the parallel CRC code ACRC. Outputting of the parallel CRC code ACRC may then occur after a slight delay (e.g., t2). A time difference Tc between the time point of outputting the parallel data ADATA and the time point of outputting the parallel CRC code (ACRC) may correspond to at least one period of the clock signal CLK. For example, the time difference Tc may be the same as or greater than one period of the clock signal CLK, or the same as or greater than two periods of the click signal CLK.

In one embodiment, the time difference Tc may guarantee a minimum time required for the CRC circuit 300 to calculate the CRC code. Thus, the CRC circuit 300 may calculate the CRC code based on the parallel data ADATA output from the data parallel circuit 200.

Also, in one embodiment, the CRC circuit 300 compares the calculated CRC code and the parallel CRC code ACRC output from the data parallel circuit 200 with each other and detects an error of the serial data D0~D7 according to the result of comparison. When an error is detected from the serial data D0~D7, the CRC circuit 300 may output an error detection signal ERR having an activation period (e.g., enabled error detection signal). Also, when an error is not detected from the serial data, the CRC circuit 300 outputs an error detection signal ERR having a deactivation period (e.g., disabled error detection signal) to the host. The memory core 400 may perform writing operation in response to the disabled error detection signal ERR. The activation period may correspond to a logic high level, for example, and the deactivation period may correspond to a logic low level.

The enabled error detection signal ERR generated by the CRC circuit 300 may be transmitted to the host. Accordingly, the host may retransmit the serial data D0~D7 to the memory device 10 in response to the enabled error detection signal ERR. Additionally, when an error is not detected from the serial data, the CRC circuit 300 outputs an error detection signal ERR having a deactivation period (e.g., disabled error detection signal) to the host. The memory core 400 may perform writing operation in response to a command signal (not shown), for example, a write command signal, received from the host.

Although times for inputting and outputting data (e.g., D0-D7, C0, and C1) are described above in connection with certain rising or falling edges of a clock signal, they may occur at different moments, so that, for example, data D0 is input as a falling edge of the clock signal, and the parallel data ADATA and the parallel CRC code ACRC also output in response to a falling edge of the clock signal.

Figure 7A:
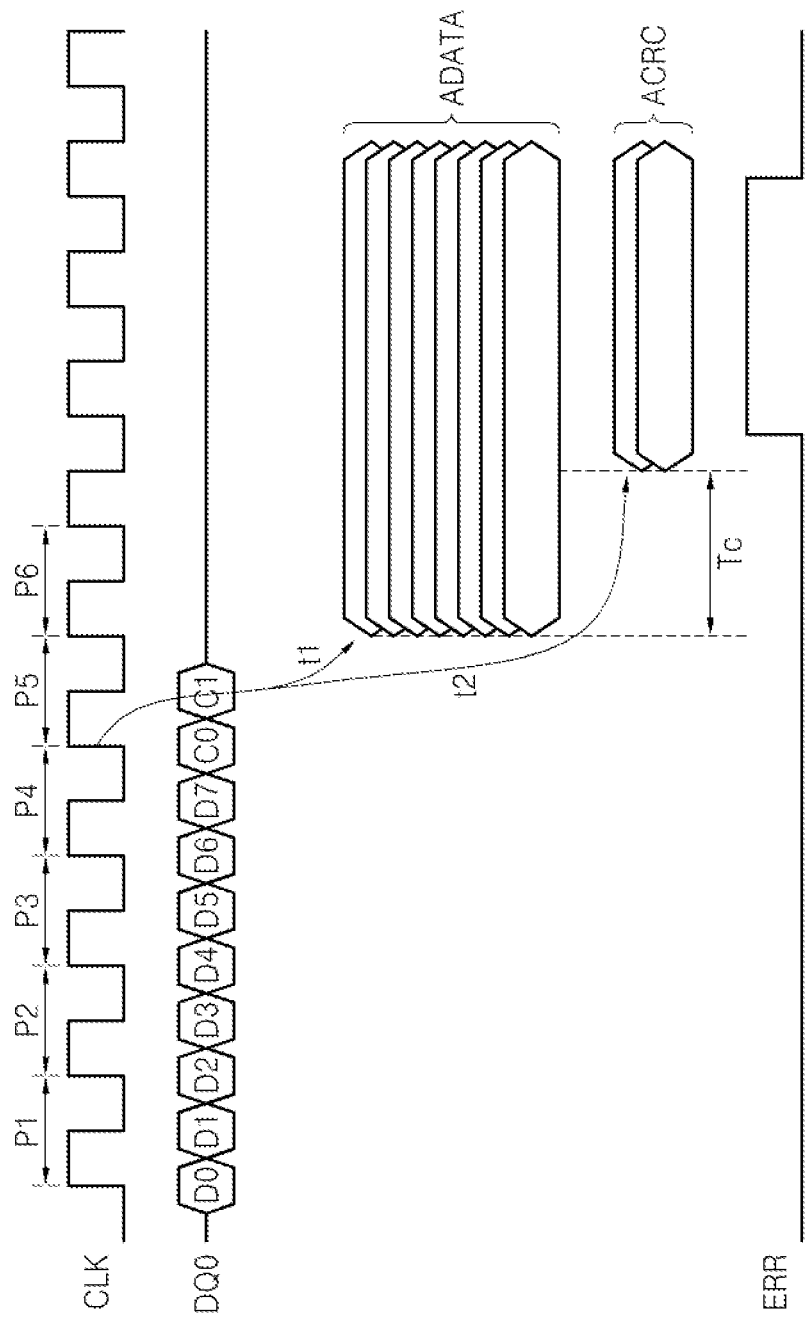
FIG. 7A is an operation timing diagram for explaining another exemplary embodiment of the operation of the memory device shown in FIG. 3.

FIG. 7A is an operation timing diagram for explaining another exemplary embodiment of the operation of the memory device shown in FIG. 3. Referring to FIGS. 3 through 5, and FIG. 7A, the data parallel circuit 200 may determine both of a time point of outputting the parallel data ADATA and a time point of outputting the parallel CRC code (ACRC) in response to a rising edge of the fifth period P5. A delay time t1 indicates a delay time from the rising edge of the fifth period P5 to the time point of outputting the parallel data ADATA. For example, the delay time t1 may be the same as or greater than one period of the clock signal CLK. A delay time t2 indicates a delay time from the rising edge of the fifth period P5 to the time point of outputting the parallel CRC code (ACRC). For example, the delay time t2 may be generated using by predetermined additional delay time the same as or greater than two periods of the clock signal CLK. A time difference Tc between the time point of outputting the parallel data ADATA and the time point of outputting the parallel CRC code (ACRC) may correspond to at least one period of the clock signal CLK. For example, the time difference Tc may be the same as or greater than one period of the clock signal CLK, or the same as or greater than two periods of the click signal CLK.

FIG. 7B is an operation timing diagram for explaining other exemplary embodiment of the operation of the memory device shown in FIG. 3. Referring to FIGS. 3 through 5, and FIG. 7B, the data parallel circuit 200 may determine both a time point of outputting the parallel data ADATA and a time point of outputting the parallel CRC code ACRC in response to a rising edge of a sixth period P6 of the clock signal CLK. A delay time t1 indicates a delay time from the rising edge of the fifth period P6 to the time point of outputting the parallel data ADATA. For example, the delay time t1 may be the same as or greater than one period of the clock signal CLK. A delay time t2 indicates a delay time from the rising edge of the fifth period P6 to the time point of outputting the parallel CRC code (ACRC). For example, the delay time t2 may be the same as or greater than two periods of the clock signal CLK by using a predetermined additional delay time. A time difference Tc between the time point of outputting the parallel data ADATA and the time point of outputting the parallel CRC code ACRC may correspond to at least one period of the clock signal CLK. For example, the time difference Tc may be the same as or greater than one period of the clock signal CLK or the same as or greater than two periods of the clock signal.

The CRC circuit 300 calculates the CRC code based on the parallel data ADATA output from the data parallel unit 200. Also, the CRC circuit 300 compares the calculated CRC code and the parallel CRC code ACRC output from the data parallel circuit 200 with each other and detects an error of the serial data D0~D7 according to the result of comparison. When an error is detected from the serial data D0~D7, the CRC circuit 300 may output an error detection signal ERR having an activation period (e.g., enabled error detection signal) to the host. For example, the host may retransmit the serial data D0~D7 to the memory device 10 in response to the enabled error detection signal ERR.

Figure 8:
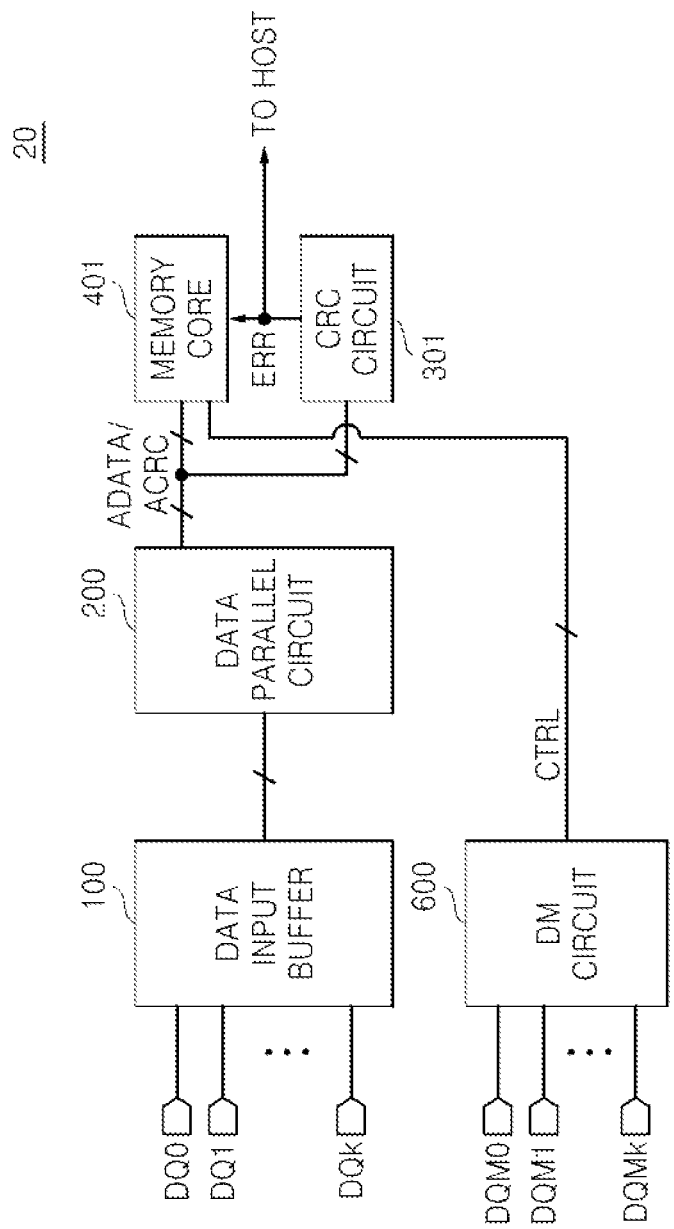
FIG. 8 is a block diagram of a semiconductor device according to another exemplary embodiment.

FIG. 8 is a block diagram of a semiconductor device according to another exemplary embodiment. Referring to FIG. 8, the memory device 20 includes the data input buffer 100, the data parallel circuit 200, a CRC circuit 301, a memory core 401, and a data masking circuit 600.

The data input buffer 100 buffers a serial data and a serial CRC code transmitted from a host (not shown) through a plurality of data input pads DQ0 through DQk (K is a natural number). The data parallel circuit 200 converts the serial data and the serial CRC code output from the data input buffer 100 into a parallel data ADATA and a parallel CRC code ACRC, respectively.

The CRC circuit 301 calculates a CRC code by using the parallel data ADATA output from the data parallel circuit 200. Also, the CRC circuit 301 compares the calculated CRC code and the parallel CRC code ACRC output from the parallel circuit 200 and detects an error of the serial data based on the result of comparison.

When an error is detected from the serial data, the CRC circuit 301 outputs an error detection signal ERR having an activation period (e.g., enabled error detection signal) to the host and the memory core 401. The host may retransmit the serial data to the memory device 20 in response to the error detection signal ERR. Also, when an error is not detected from the serial data, the CRC circuit 301 outputs an error detection signal ERR having a deactivation period (e.g., disabled error detection signal) to the host and the memory core 401. The memory core 401 may perform writing operation in response to the disabled error detection signal ERR.

The memory core 401 may perform the write operation for writing the parallel data output from the data parallel circuit 200 to each of the plurality of memory cells of the memory cell array included in the memory core 401 in response to a command signal (not shown), for example, a write command signal, received from the host. In one embodiment, the memory core 401 may block the write operation in response to the error detection signal ERR. Additionally, the memory core 401 may write data to each of the plurality of memory cells in response to the disabled error detection signal ERR.

The data masking circuit 600 receives masking signals transmitted through each of a plurality of data masking pads DQM0 through DQMK (K is a natural number) and outputs a plurality of control signals CTRL to block an undesired data to be written during the write operation with respect to the memory core 401.

In one embodiment, one or all of the data input buffer 100, the data parallel circuit 200, the CRC circuit 301, the memory core 401, and the DM circuit 600 may be controlled in response to a clock signal CLK (not shown).

Figure 9:
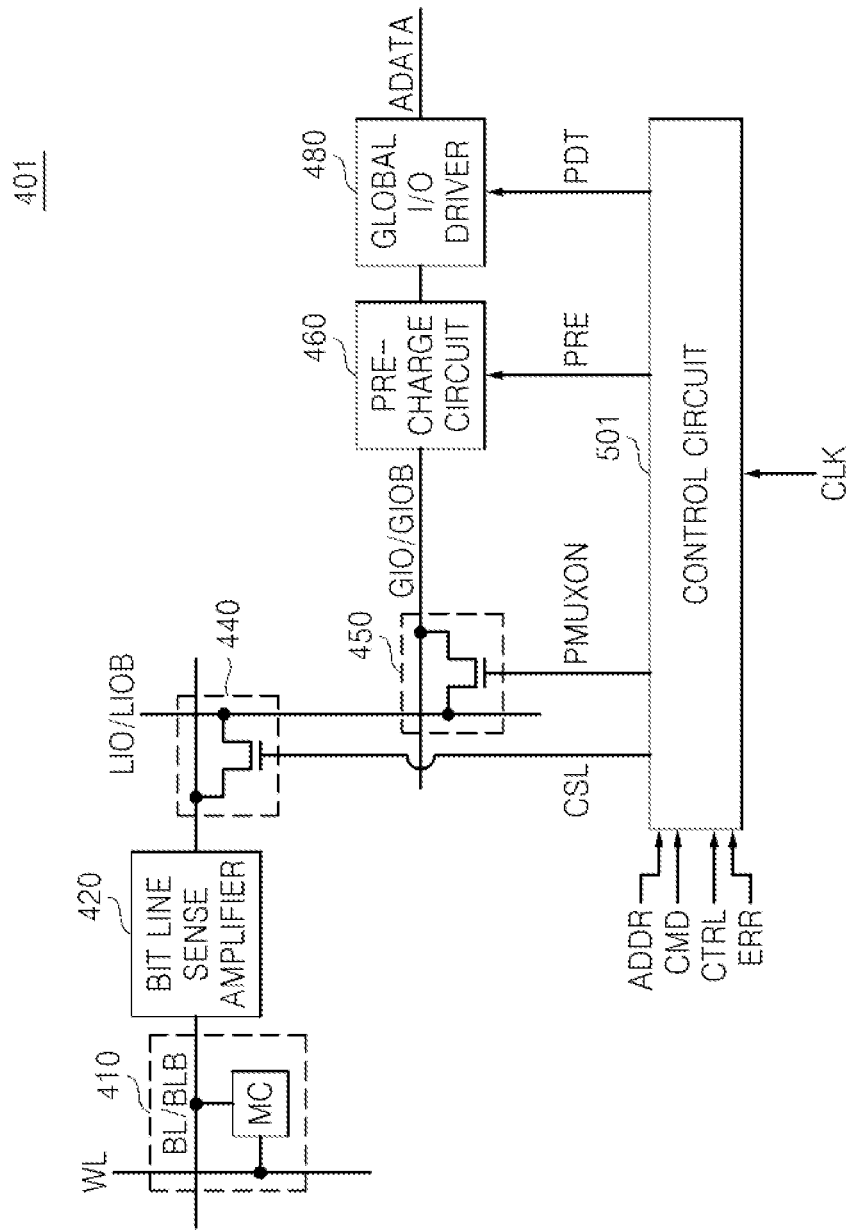
FIG. 9 illustrates a memory core shown in FIG. 8 according to an exemplary embodiment.

FIG. 9 illustrates the memory core shown in FIG. 8 according to an exemplary embodiment. Referring to FIGS. 8 and 9, the memory core 401 includes a memory cell array 410 including a plurality of memory cells MC, a bit line sense amplifier 420, a column selection circuit 440, a local-global input/output gate circuit 450, a precharge circuit 460, a global input/output driver 480, and a control circuit 501.

The memory cell array 410 includes a plurality of memory cells. Each memory cell MC of the plurality of memory cells may be arranged in a form of matrix arranged in a form of matrix. The memory cell MC is connected between a bit line BL (or complementary bit line BLB) and a word line WL. During the write operation, a parallel data ADATA output from the data parallel circuit 200 may be written to the memory cell MC.

The bit line sense amplifier 420 detects and amplifies a data stored in the memory cell MC by detecting and amplifying the voltage difference or the current difference between the bit line BL and the complementary bit line BLB. The column selection circuit 440 is connected between the bit line BL and a local input/output line LIO, and/or between the complementary bit line BLB and a complementary local input/output line LIOB. The column selection circuit 440 controls the connection between the bit line pair BL/BLB and the local input/output line pair LIO/LIOB in response to the column selection line signal CSL.

For example, when a column selection line signal CSL output from the control circuit 501 is activated, the column selection circuit 440 may control the connection between the bit line pair BL/BLB and the input/output line pair LIO/LIOB such that the parallel data ADATA may be transmitted between the bit line pair BL/BLB and the local input/output line pair LIO/LIOB.

The local-global input/output gate circuit 450 is connected between the local input/output line LIO and a global input/output line GIO, and/or between the complementary local input/output line LIOB and a complementary global input/output line GIOB. The local-global input/output gate circuit 450 controls the connection between the local input/output line pair LIO/LIOB and the global input/output line pair GIO/GIOB in response to a local-global input/output selection line PMUXON.

For example, when the local-global input/output selection signal PMUXON output from the control circuit 501 is activated, the local-global input/output gate circuit 450 controls the connection between the local input/output line pair LIO/LIOB and the global input/output line pair GIO/GIOB such that the parallel data ADATA may be transmitted between the local input/output line pair LIO/LIOB and the global input/output line pair GIO/GIOB.

The precharge circuit 460 precharges the global input/output line GIO and the complementary global input/output line GIOB into a predetermined precharge voltage level in response to the precharge signal PRE output from the control circuit 501.

The global input/output driver 480 drives the global input/output line pair GIO/GIOB through the precharge circuit 460 in response to the parallel data ADATA output from the data parallel circuit 200 and an enable signal PDT output from the control circuit 500 in the write operation.

The control circuit 501 drives the selected word line WL and outputs the column selection signal CSL, the local-global input/output selection signal PMUXON, the precharge signal PRE, and the enable signal PDT in response to an address signal ADDR and a command signal CMD input from the outside. In one embodiment, the command signal CMD may include the address signal ADDR.

Also, the control circuit 501 may deactivate at least one of the column selection signal CSL, the local-global input/output selection signal PMUXON, the precharge signal PRE, and the enable signal PDT in response to the control signals CTRL output from the data masking circuit 600. The control circuit 501 may block the write operation in response to the error detection signal ERR output from the CRC circuit 301.

Figure 10:
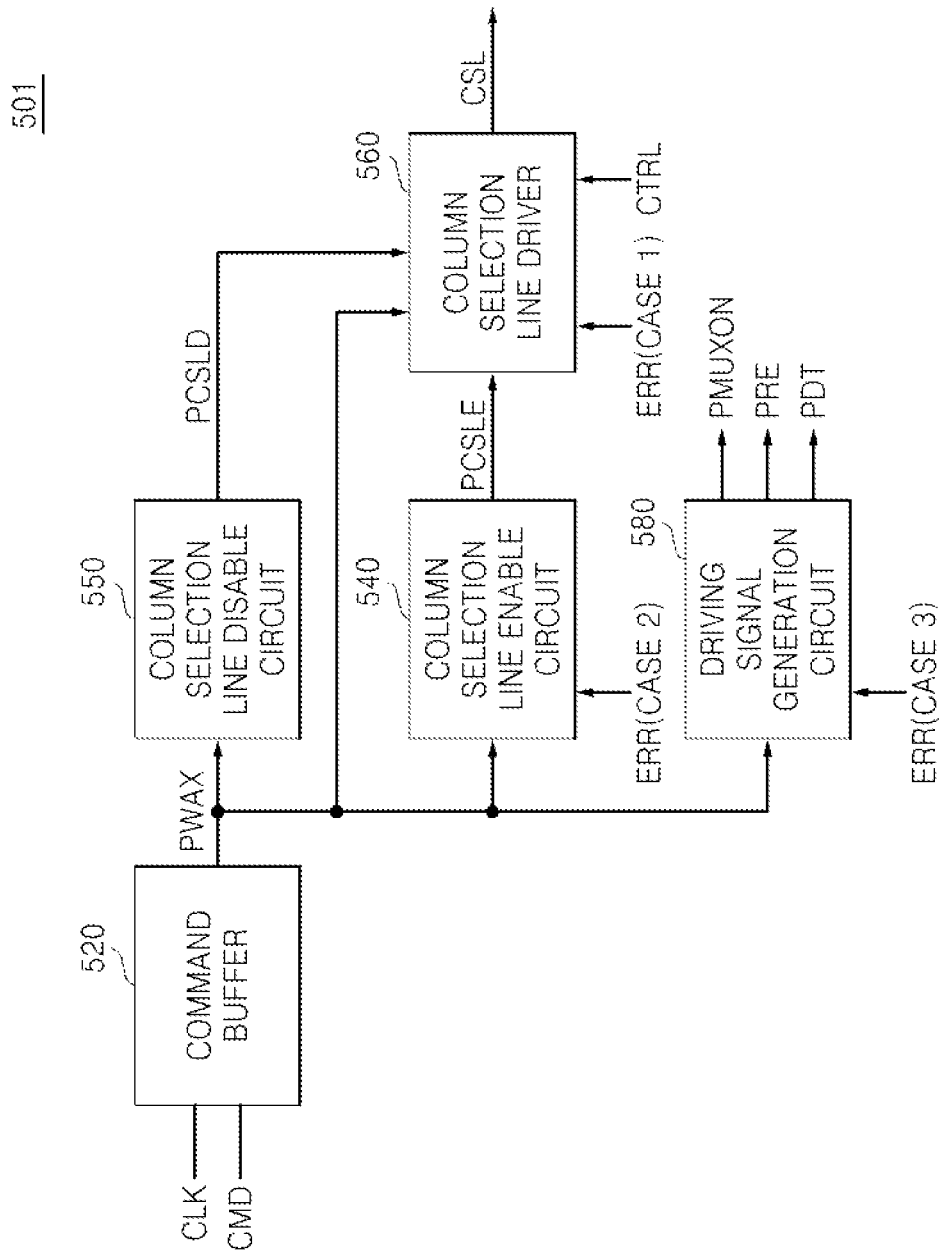
FIG. 10 is a block diagram of a control circuit shown in FIG. 9 according to an exemplary embodiment.

FIG. 10 is a block diagram of the control circuit shown in FIG. 9 according to an exemplary embodiment. Referring to FIGS. 8 through 10, the control circuit 501 includes a command buffer 520, a column selection line enable circuit 540, a column selection line disable circuit 550, a column selection driver 560, and a driving signal generation circuit 580.

The command buffer 520 outputs a write activation signal PWAX for performing the write operation in response to the clock signal CLK and the command signal CMD, for example, a write command signal. The command buffer 520 outputs a control signal for driving the word line WL corresponding to the address signal ADDR. The address signal ADDR may be included in the command signal CMD.

The column selection enable circuit 540 outputs a column selection line enable signal PCSLE for controlling an activation time point and/or an activation period of the column selection line signal CSL which is an output signal of the column selection line driver 560 in response to the write activation signal PWAX. The column selection line disable circuit 550 outputs a column selection disable signal PCSLD for controlling a deactivation time point and/or a deactivation period of the column selection line signal CSL in response to the write activation signal PWAX.

The column selection line driver 560 outputs the column selection line signal CSL for selecting the bit line pair BL/BLB corresponding to the memory cell MC to which the write operation is to be performed in response to the write activation signal PWAX. The activation time point and/or the activation period of the column selection signal CSL is determined by the column selection line enable signal PCSLE, and the deactivation time point and/or the deactivation period of the column selection line signal CSL is determined by the column selection line disable signal PCSLD. Also, the column selection driver 560 may output the deactivated column selection line signal CSL in response to the control signals CTRL output from the data masking circuit 600.

The driving signal generation circuit 580 outputs the local-global input/output selection signal PMUXON, the precharge signal PRE, and the enable signal PDT in response to the write activation signal PWAX.

The column selection line driver 560 may block the write operation of the memory core 401 by outputting the deactivated column selection line signal CSL in response to the error detection signal ERR (CASE 1). The column selection line enable circuit 540 may block the write operation of the memory core 401 by outputting the deactivated column selection line enable signal PCSLE in response to the error detection signal ERR (CASE 2).

The driving signal generation circuit 580 may block the write operation of the memory core 401 by outputting the deactivated local-global input/output selection signal PMUXON or the deactivated enable signal PDT in response to the error detection signal ERR (CASE 3).

As shown in FIG. 10, the error detection signal ERR may be input into at least one among the column selection line enable circuit 540, the column selection line driver 560, and the driving signal generation circuit 580.

Figure 11:
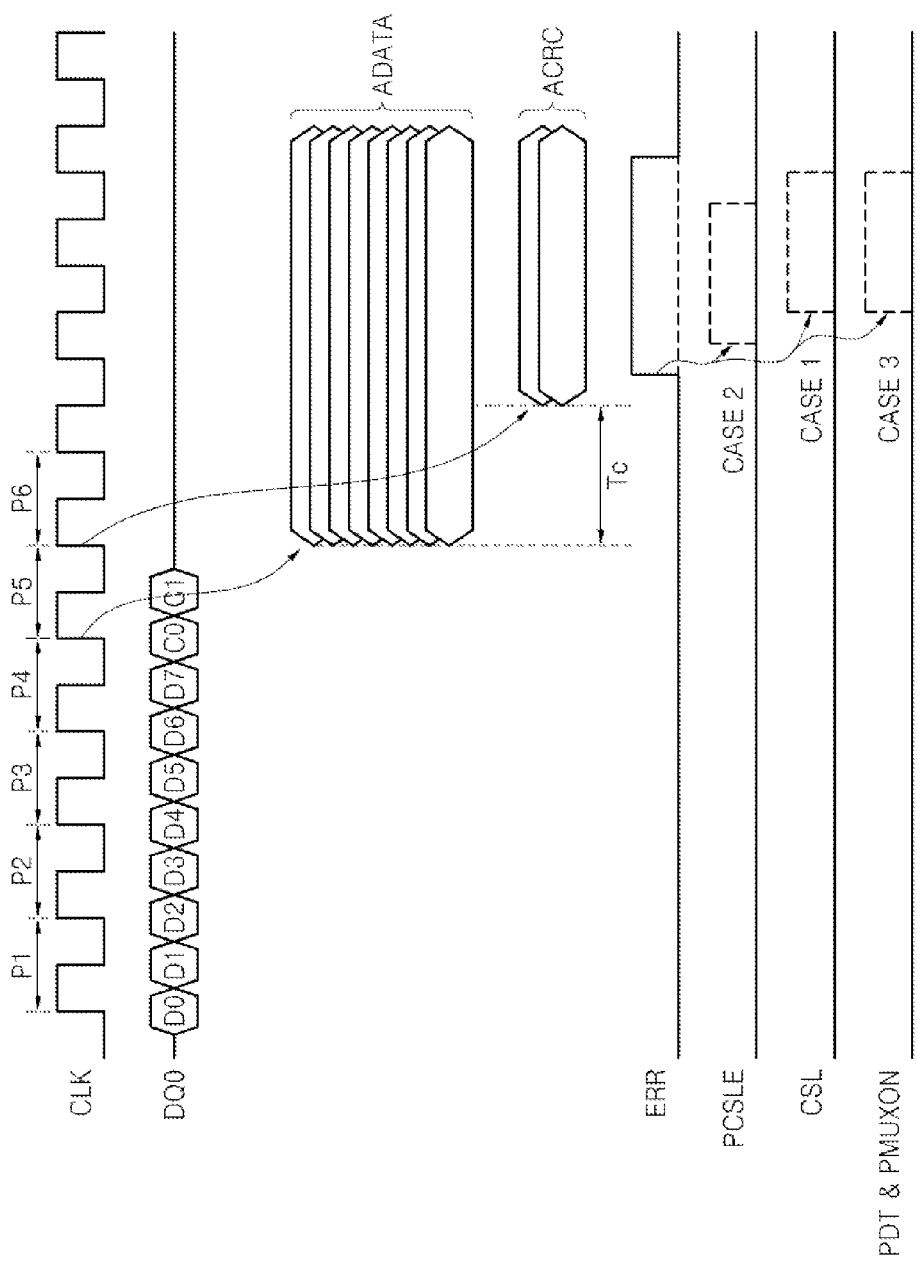
FIG. 11 is an operation timing diagram for explaining an exemplary embodiment of the operation of a memory device shown in FIG. 8.

FIG. 11 is an operation timing diagram for explaining an exemplary embodiment of the operation of the memory device shown in FIG. 8. Referring to FIGS. 8 through 11, the data input buffer 100 receives the serial data D0~D7 and the serial CRC code C0 and C1 that are input based on the clock signal CLK. At this time, the serial data D0~D7 are 8 bits, and the CRC code C0 and C1 are 2-bits.

A first data bit D0 included in the serial data D0~D7 is input synchronizing with a rising edge of a first period P1 of the clock signal CLK, and a second data bit D1 is input synchronizing with a falling edge of the first period P1. A third data bit D2 is input synchronizing with a rising edge of a second period P2 of the clock signal CLK, and a fourth data bit D3 is input synchronizing with a falling edge of the second period P2. A fifth data bit D4 is input synchronizing with a rising edge of a third period P3 of the clock signal CLK, and a sixth data bit D5 is input synchronizing with a falling edge of the third period P3. A seventh data bit D6 is input synchronizing with a rising edge of a fourth period P4 of the clock signal CLK, and a eighth data bit D7 is input synchronizing with a falling edge of the fourth period P4.

A first CRC bit C0 included in the serial CRC code is input synchronizing with a rising edge of a fifth period P5 of the clock signal CLK, and the second CRC bit C1 is input synchronizing with a falling edge of the fifth period P5.

A data masking signal received through the data masking pad DQM0 has an activation period for the period corresponding to the rising edge of the first period P1. Accordingly, the data masking circuit 600 outputs a control signal to block the first data bit D0 to be written to the expected memory cell. At this time, the column selection line driver 560 may deactivate the column selection line signal CSL for selecting the bit line connected to the expected memory cell in response to the control signal. Accordingly, the first data bit D0 may not be written to the memory cell.

For instance, when the activation period of the masking signal corresponds to the falling edge of the first period P1, the second data bit D1 may not be written to the memory cell.

The data parallel circuit 200 parallelizes an output signal of the data input buffer 100. That is, the data parallel circuit 200 parallelizes the serial data D0~D7 and the serial CRC code C0 and C1 and outputs the parallel data ADATA and the parallel CRC code ACRC.

The data parallel circuit 200 may determine a time point of outputting the parallel data ADATA in response to a rising edge of a fifth period P5, and a time point of outputting the parallel CRC code ACRC in response to a rising edge of a sixth period P6 of the clock signal CLK. A time difference Tc between the time point of outputting the parallel data ADATA and the time point of outputting the parallel CRC code ACRC may correspond to at least one period of the clock signal CLK. For example, the time difference Tc is the same as or greater than a period of the clock signal CLK, and the same as or smaller than two periods of the clock signal CLK.

The time difference Tc may denote a minimum time required for the CRC circuit 300 to calculate the CRC code. Thus, the CRC circuit 300 calculates the CRC code based on the parallel data ADATA output from the data parallel circuit 200.

Also, the CRC circuit 301 compares the calculated CRC code and the parallel CRC code ACRC output from the data parallel circuit 200 and detects an error of the serial data D0~D7 according to the result of comparison. When an error is detected in the serial data D0~D7, the CRC circuit 301 outputs the error detection signal ERR having an activation period (e.g., enabled error detection signal) to the host. For example, the host retransmits the serial data D0~D7 to the memory device 20 in response to the enabled error detection signal ERR. Additionally, when an error is not detected from the serial data, the CRC circuit 301 outputs an error detection signal ERR having a deactivation period (e.g., disabled error detection signal) to the host. The memory core 401 may perform a writing operation in response to the disabled error detection signal ERR.

The column selection driver 560 may output the deactivated column selection line signal CSL or an activated column selection line signal CSL in response to the enabled error detection signal ERR or the disabled error detection signal ERR, respectively (CASE 1). Accordingly, the serial data D0~D7 may not be or may be written to a memory cell array, respectively.

The column selection line enable circuit 540 may output the deactivated column selection line enable signal PCSLE or an activated column selection line enable signal PCSLE in response to the enabled error detection signal ERR or the disabled error detection signal ERR, respectively (CASE 2). Accordingly, the serial data D0~D7 may not be or may be written to a memory cell array, respectively.

The driving signal generation circuit 580 may output the deactivated local global input/output selection signal PMUXON or the deactivated enable signal PDT in response to the enabled error detection signal ERR (CASE 3). Accordingly, the serial data D0~D7 may not be written to a memory cell array. Additionally, the driving signal generation circuit 580 may output an activated local global input/output selection signal PMUXON or an activated enable signal PDT in response to the disabled error detection signal ERR (CASE 3). Accordingly, the serial data D0~D7 may be written to a memory cell array.

Figure 12:
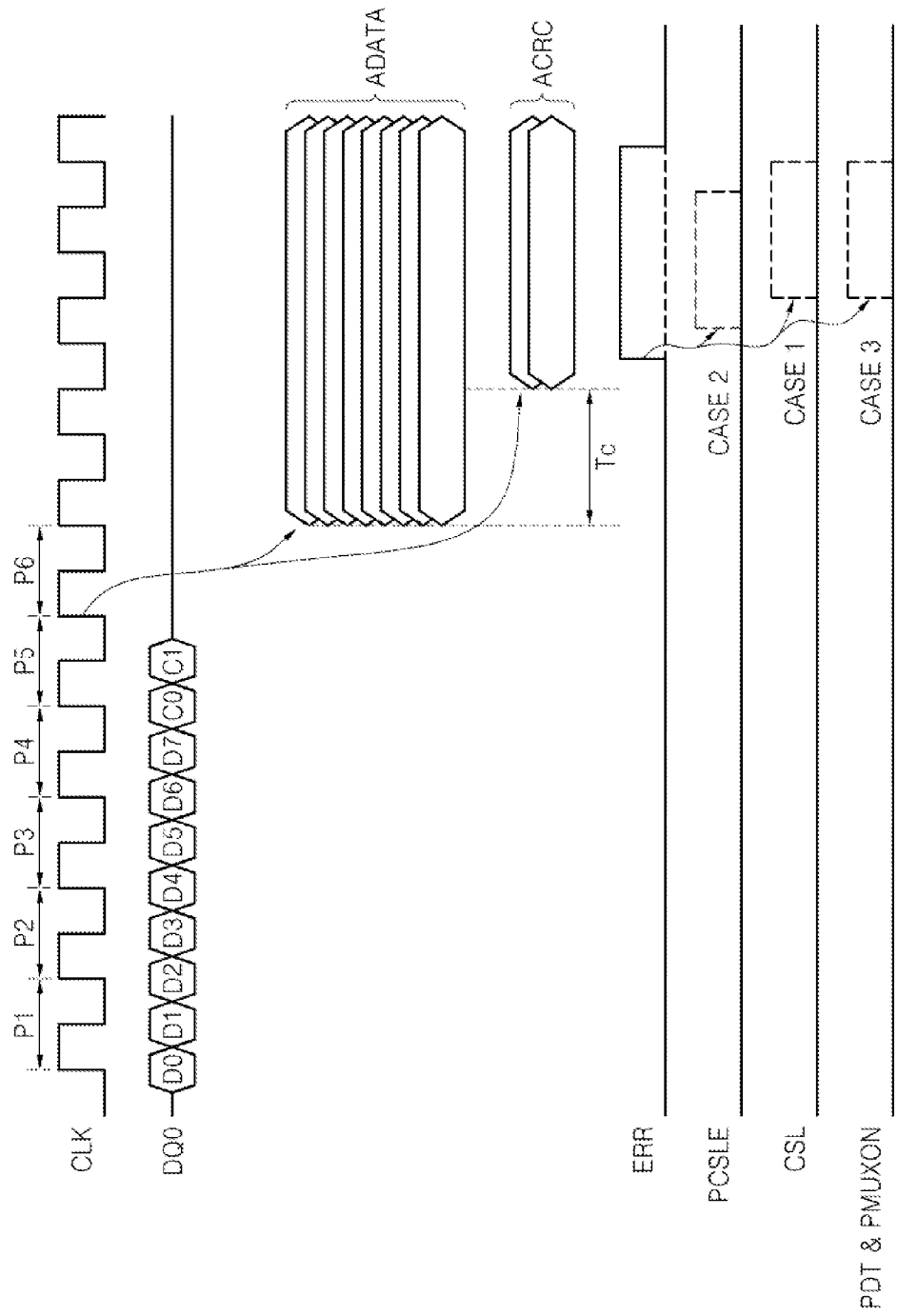
FIG. 12 is an operating timing diagram for explaining another exemplary embodiment of the memory device shown in FIG. 8.

FIG. 12 is an operation timing diagram for explaining another exemplary embodiment of the operation of the memory device shown in FIG. 8. Referring to FIGS. 8 through 10, and 12, the data parallel circuit 200 may determine both a time point of outputting the parallel data ADATA and the time point of outputting the parallel CRC code ACRC in response to a rising edge of a sixth period P6 of the clock signal CLK. A time difference Tc between the time point of outputting the parallel data ADATA and the time point of outputting the parallel CRC code ACRC may correspond to at least one period of the clock signal CLK. For example, the time difference Tc may be the same as or greater than a period of the clock signal CLK, or the same as or smaller than two periods of the clock signal CLK.

The CRC circuit 301 calculates the CRC code based on the parallel data ADATA output from the data parallel circuit 200. Also, the CRC circuit 301 compares the calculated CRC code and the parallel CRC code ACRC output from the data parallel circuit 200 with each other and detects an error of the serial data D0 through D7 according to the result of comparison.

When an error is detected in the serial data D0~D7, the CRC circuit 301 outputs the error detection signal ERR having an activation period (e.g., enabled error detection signal) to the host. For example, the host retransmits the serial data D0~D7 to the memory device 20 in response to the enabled error detection signal ERR. Additionally, when an error is not detected from the serial data, the CRC circuit 301 outputs an error detection signal ERR having a deactivation period (e.g., disabled error detection signal) to the host. The memory core 401 may be performed writing operation in response to the disabled error detection signal ERR.

The column selection line driver 560 may output the deactivated column selection line signal CSL or an activated column selection line signal CSL in response to the enabled error detection signal ERR or the disabled error detection signal ERR, respectively (CASE 1). Accordingly, the serial data D0~D7 may not be or may be written to the memory cell array, respectively.

The column selection enable circuit 540 may output the deactivated column selection enable signal PCSLE or an activated column selection line enable signal PCSLE in response to the enabled error detection signal ERR or the disabled error detection signal ERR, respectively (CASE 2). Accordingly, the serial data D0~D7 may not be or may be written to the memory cell array, respectively.

The driving signal generation circuit 580 may output the deactivated local global input/output selection signal PMUXON or the deactivated enable signal PDT in response to the enabled error detection signal ERR (CASE 3). Accordingly, the serial data D0~D7 may not be written to a memory cell array. Additionally, the driving signal generation circuit 580 may output an activated local global input/output selection signal PMUXON or an activated enable signal PDT in response to the disabled error detection signal ERR (CASE 3). Accordingly, the serial data D0~D7 may be written to a memory cell array.

Figure 13:
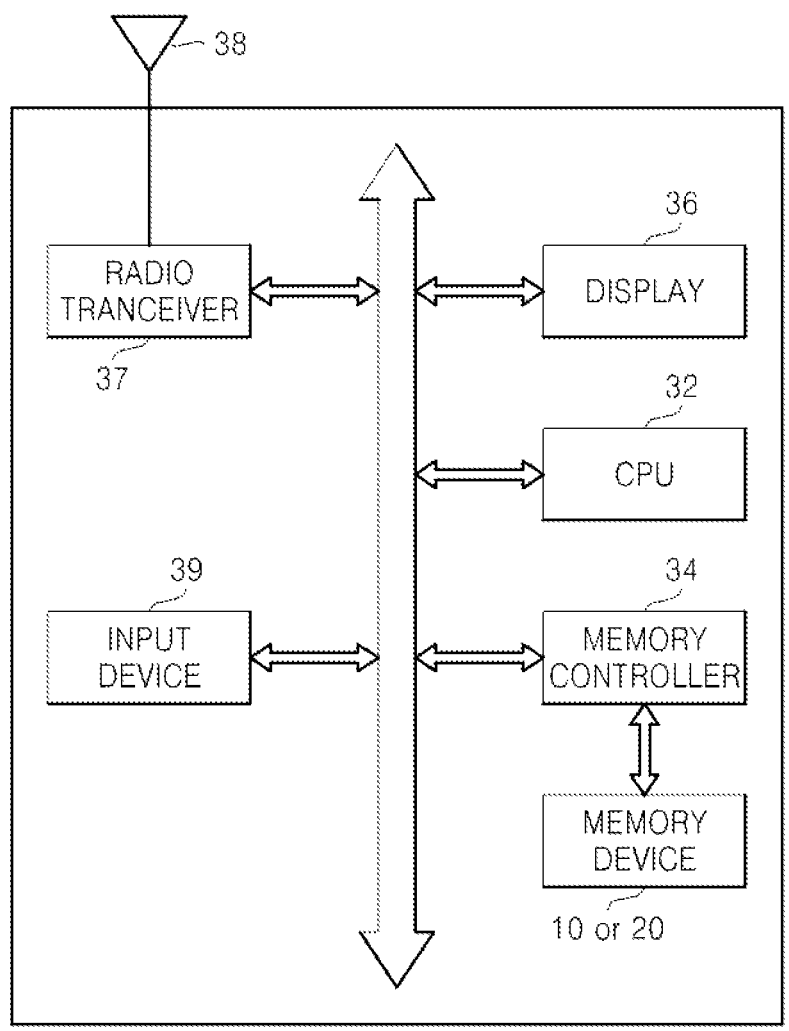
FIG. 13 is a block diagram of a memory system including the memory device shown FIG. 3 or 8 according to exemplary embodiments.

FIG. 13 is a block diagram of a memory system having the memory device shown in FIG. 3 or 8 according to exemplary embodiments. Referring to FIGS. 3, 8, and 13, the memory system 30 may be embodied, for example, into a personal computer (PC), storage such as a data server, or portable device.

The portable device may be embodied, for example, into a mobile phone, smart phone, tablet PC, or wireless internet device.

The memory system 30 may include a memory device 10 or 20, a CPU 32 for controlling the data process operation of the memory device 10 or 20 and a memory controller 34 for controlling the data access operation, for example, the write operation or the read operation, with respect to the memory device 10 or 20 under the control of the CPU 32.

A data stored in the memory device 10 or 20 may be displayed through a display 36 under the control of the CPU 32 or the memory controller 34.

A radio transceiver 37 may exchange a radio signal through an antenna 38. For example, the radio transceiver 37 may convert the radio signal received through the antenna 38 into the signal that the CPU 32 may process. Thus, the CPU 32 may process the signal output from the radio transceiver 37 and store the processed signal to the memory device 10 or 20 through the memory controller 34, or display the processed signal through the display 36. Also, the radio transceiver 37 may convert the signal output from the CPU 32 to the radio signal and output the radio signal through the antenna 38 to outside.

An input device 39 is for inputting a data to be processed by a control signal controlling the operation of the CPU 32 or the CPU 32 and may be embodied into a pointing device such as touch pad and computer mouse, a keypad, or a keyboard.

The CPU 32 may control the operation of the display 36 such that a data output from the memory device 10 or 20, a data output from the radio transceiver 37, or a data output from the input device 39 may be displayed through the display 36.

A plurality of the memory devices 10 or 20 may be stacked with each other and share the data input/output buffer 100. At this time, the plurality of memory devices 10 or 20 may be connected through a vertical electrical connection (via) such as a through-silicon via (TSV).

The stacked memory devices 10 or 20 may be packaged in one package. At this time, the package may be replaced by the memory device 10 or 20 of FIG. 13.

A signal transmitted from the host to the memory device 10 or 20 may be transmitted through an electrical signal line or an optical signal line.

At this time, the data input/output buffer 100 may include a circuit block capable of performing optical-to-electrical conversion and/or electrical-to-optical conversion.

The memory device according to some exemplary embodiments has an effect of detecting an error of a data transmitted to the memory device that might be generated during the transmission process. Also, the memory device has an effect of blocking the write operation that the data is written to a memory cell array, based on the detected error.

While the present disclosure has been particularly shown and described with reference to exemplary embodiments thereof, it will be understood by those of ordinary skill in the art that various changes in forms and details may be made therein without departing from the scope of the following claims.

What is claimed is:

1. A method for operating a memory device, the method comprising:
    receiving a serial data and a serial cyclic redundancy check (CRC) code transmitted sequentially through a channel in response to a clock signal;
    converting the serial data into a parallel data and the serial CRC code into a parallel CRC code;
    outputting the parallel data at a first time point;
    outputting the parallel CRC code at a second time point later than the first time point;
    calculating a CRC code by using the parallel data;
    comparing the parallel CRC code and the calculated CRC code with each other and detecting an error of the serial data transmitted through the channel according to the result of the comparison; and
    outputting an error detection signal in response to the result of the comparison,
    wherein the first time point is determined in response to an nth rising edge of the clock signal received after all of the serial data are received, and
    wherein the second time point is determined in response an (n+m)th rising edge of the clock signal received after all of the serial data are received, wherein n is a integer being 1 or greater and m is a integer being 0 or greater.

2. The method of claim 1, wherein m is 0, and wherein the second time point is further determined using by a predetermined additional delay time.

3. The method of claim 1 wherein m is 1.

4. The method of claim 1, further comprising, in response to the error being detected, blocking a write operation for writing the parallel data to a memory cell array.

5. The method of claim 4, wherein blocking the write operation comprises deactivating a column selection line signal for selecting a bit line to transmit the parallel data to the memory cell array.

6. The method of claim 5, further comprising activating the column selection line signal in response to an error detection signal generated when the error is not detected.

7. The method of claim 1, further comprising receiving serial data and the serial CRC code again, in response to an error detection signal generated when the error is detected.

8. A method for operating a memory device including a memory cell array, the method comprising:
receiving a serial data and a serial cyclic redundancy check (CRC) code transmitted sequentially through a channel in response to a clock signal;
converting the serial data into a parallel data and the serial CRC code into a parallel CRC code;
outputting the parallel data at a first time point;
outputting the parallel CRC code at a second time point later than the first time point;
calculating a CRC code by using the parallel data;
comparing the parallel CRC code and the calculated CRC code with each other to determine whether an error of the serial data is detected;
outputting an error detection signal indicating whether the error is detected or not;
in response to the error detection signal indicating that the error is detected, blocking writing of the parallel data to the memory cell array; and
in response to the error detection signal indicating that the error is not detected, writing the parallel data to the memory cell array;
wherein the first time point is determined in response to an nth rising edge of the clock signal received after all of the serial data are received, and
wherein the second time point is determined in response to an (n+m) th rising edge of the clock signal received after all of the serial data are received,
wherein n is an integer being 1 or greater and m is an integer being 0 or greater.

9. The method of claim 8, wherein m is 0, and wherein the second time point is further determined using by a predetermined additional delay time.

10. The method of claim 8, wherein blocking writing of the parallel data to the memory cell array comprises deactivating a column selection line signal for selecting a bit line to transmit the parallel data to the memory cell array.

11. The method of claim 8, wherein writing the parallel data to the memory cell array comprises activating a column selection line signal for selecting a bit line to transmit the parallel data to the memory cell array.

12. A memory device comprising:
a memory cell array including a plurality of memory cells;
a data parallel circuit configured to parallelize each of a serial data and a serial cyclic redundancy check (CRC) code transmitted through a channel in response to a clock signal and to output a parallel data and a parallel CRC code, respectively;
a CRC circuit configured to calculate a CRC code by using the parallel data, to compare the calculated CRC code with the parallel CRC code, to detect an error of the serial data according to the result of comparison, and to output an error detection signal indicating whether the error is detected or not;
a control circuit configured to output a plurality of control signals for controlling a write operation for writing the parallel data to one or more memory cells of the plurality of memory cells;
a column selection circuit configured to connect a bit line of the one or more memory cells to a local input/output line for writing the parallel data to the one or more memory cells in response to a column selection line signal of the control signals,
wherein the data parallel circuit is configured to output the parallel data at a first time point and output the parallel CRC code at a second time point later than the first time point,
wherein the CRC circuit is configured to enable the error detection signal when the error of the serial data is detected, and
wherein the control circuit is configured to disable the column selection line signal in response to the enabled error detection signal so that the writing operation is blocked.

13. The memory device of claim 12, further comprising:
a local global input/output gate circuit configured to connect the local input/output line to a global input/output line in response to a switching signal; and
a global input/output driver configured to drive the parallel data into the global input/output line in response to an enable signal,
wherein the control circuit includes a driving signal generation circuit configured to disable at least one of the switching signal and the enable signal based on the error detection signal.

14. The memory device of claim 12, wherein the CRC circuit is configured to disable an error detection signal when the error of the serial data is not detected, and wherein the control circuit is configured to perform the write operation in response to the disabled error detection signal.

15. The memory device of claim 12, wherein the data parallel circuit is configured to output the parallel data at the first time point in response to an nth rising edge of the clock signal received after all of the serial data are received, and
wherein the data parallel circuit is further configured to output the parallel CRC code at the second time point in response to an (n+m)th rising edge of the clock signal received after all of the serial data are received, wherein n is an integer being 1 or greater and m is an integer being 0 or greater.

* * * * *